United States Patent
Farrell et al.

(10) Patent No.: US 9,478,506 B2
(45) Date of Patent: Oct. 25, 2016

(54) MULTILAYER PATTERN TRANSFER FOR CHEMICAL GUIDES

(71) Applicant: GLOBALFOUNDRIES Inc., Grand Cayman (KY)

(72) Inventors: Richard A. Farrell, Albany, NY (US); Gerard M. Schmid, Albany, NY (US); Sudharshanan Raghunathan, Guilderland, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 208 days.

(21) Appl. No.: 13/787,090

(22) Filed: Mar. 6, 2013

(65) Prior Publication Data

US 2014/0252660 A1 Sep. 11, 2014

(51) Int. Cl.
| | |
|---|---|
| H01L 21/311 | (2006.01) |
| H01L 23/00 | (2006.01) |
| H01L 21/308 | (2006.01) |
| H01L 21/683 | (2006.01) |
| H01L 21/768 | (2006.01) |
| H01L 21/67 | (2006.01) |

(52) U.S. Cl.
CPC ......... H01L 23/564 (2013.01); H01L 21/3086 (2013.01); H01L 21/31144 (2013.01); H01L 21/311 (2013.01); H01L 21/67109 (2013.01); H01L 21/6831 (2013.01); H01L 21/76807 (2013.01); H01L 2924/0002 (2013.01)

(58) Field of Classification Search
CPC ........... H01L 21/31144; H01L 23/564; H01L 21/76807; H01L 21/76804; H01L 2/768971; H01L 21/76897; H01L 21/311; H01L 21/6831; H01L 21/67109
USPC ................. 438/701, 702, 715, 724; 257/622, 257/E21.24, E29.026, E21.257, 787, 790
See application file for complete search history.

(56) References Cited

U.S. PATENT DOCUMENTS

| | | | |
|---|---|---|---|
| 8,796,150 B2 * | 8/2014 | Akinmade-Yusuff et al. | 438/702 |
| 2007/0015082 A1 * | 1/2007 | Angelopoulos et al. | 430/270.1 |
| 2008/0160461 A1 * | 7/2008 | Yoon et al. | 430/323 |
| 2011/0091815 A1 * | 4/2011 | Dunn et al. | 430/313 |
| 2012/0187546 A1 * | 7/2012 | Akinmade-Yusuff et al. | 257/622 |
| 2014/0038318 A1 | 2/2014 | Sato | |

\* cited by examiner

Primary Examiner — Thinh T Nguyen
(74) Attorney, Agent, or Firm — Williams Morgan, P.C.

(57) ABSTRACT

Approaches for multilayer pattern transfer for chemical guides are provided. In a typical embodiment, a device is formed by forming an etch mask layer (e.g., a nitride layer and an oxide layer) over a substrate (e.g., silicon (Si)). An orientation control layer (e.g., a neutral layer) is then formed over the etch mask layer, and an ARC layer (e.g., SiARC) is formed over the orientation control layer. In other embodiments, an organic planarization layer (OPL) and/or a protection layer may also be formed between the ARC layer and the orientation control layer. Regardless, a tapered etch profile/pattern may then be formed through the ARC and/or other layers.

13 Claims, 10 Drawing Sheets

Tapered etch provides stability and avoids collapse of neutral layer during pattern transfer. Remove neutral layer by rinsing

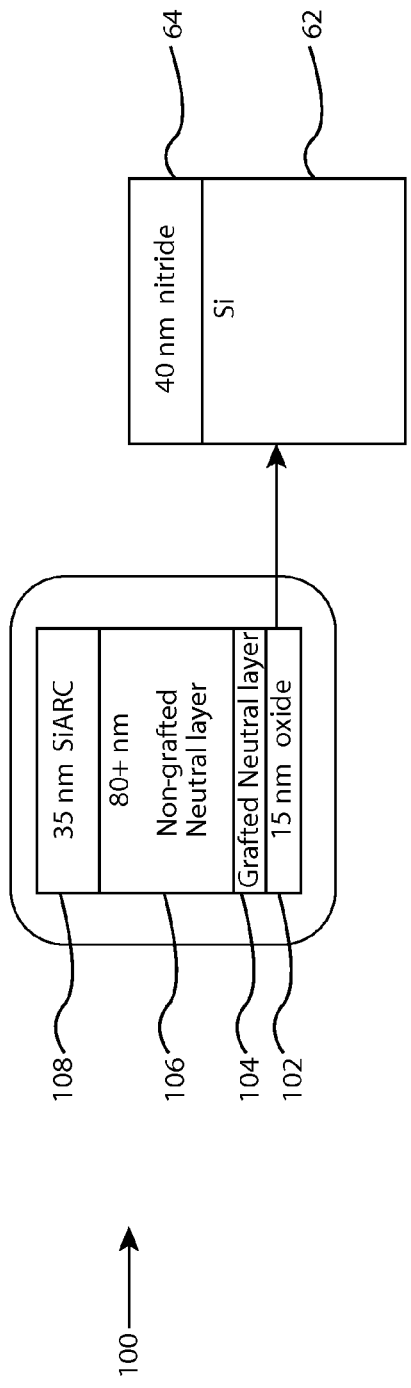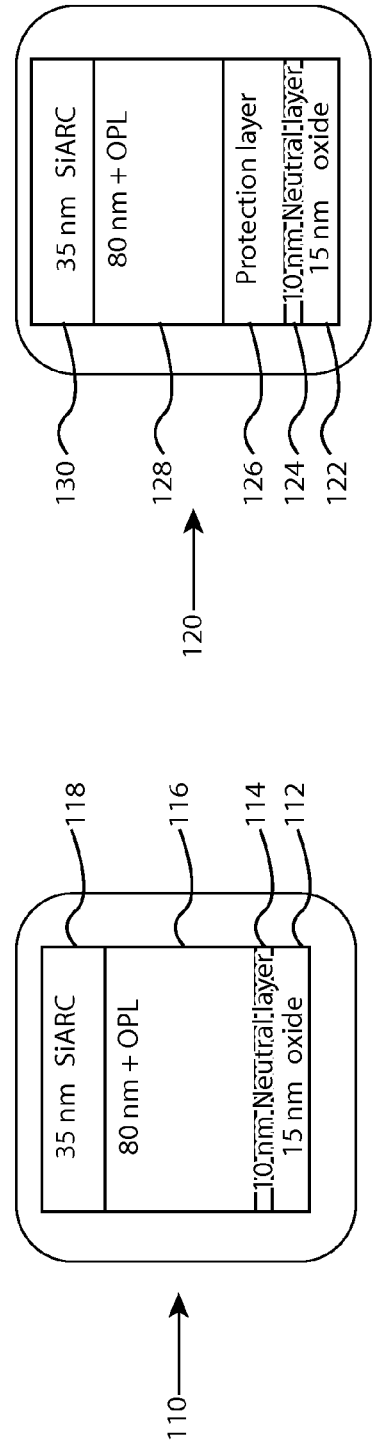

US 9,478,506 B2

MULTILAYER PATTERN TRANSFER FOR CHEMICAL GUIDES

BACKGROUND

1. Technical Field

This invention relates generally to the field of semiconductors and, more particularly, to a multilayer pattern transfer process for chemical guides.

2. Related Art

Many technological applications today require the ability to pattern precise structures with a periodicity (pitch) below a certain threshold (e.g., 60 nm). Existing optical lithography approaches are generally capable of high-throughput processing, but the patterning pitch of a single optical lithography step is limited to about 80 nm. One challenge for lithography is to provide tools, materials, and processes that can reliably and efficiently pattern structures with smaller dimensions and reduced pitch.

A significant challenge for directed self-assembly (e.g., DSA+i193 nm) or any patterning technique (e.g., extreme ultraviolet (EUV) lithography) with equivalent feature size and pitch is pattern transfer. Specifically, photoresist patterns are routinely created on multilayer stacks that are needed to reduce reflectivity, improve photoresist adhesion, minimize topographic roughness, and provide stable etch masks for subsequent pattern transfer into the underlying films. For i193 nm based patterning, individual layers such as organic planarizing layers (OPL) are typically 80-120 nm thick. Consequently, pattern transfer of the DSA pattern into this layer will result in OPL structures with aspect ratios ranging from 5:1 to 9:1. Such structures are prone to 'wiggling' and pattern collapse that may ultimately limit high-fidelity pattern transfer to the underlying silicon.

SUMMARY

In general, aspects of the present invention relate to approaches for multilayer pattern transfer. In a typical embodiment, a device is formed by forming an etch mask layer (e.g., a nitride layer and/or an oxide layer) over a substrate (e.g., silicon (Si)). An orientation control layer (e.g., a neutral layer) is then formed over the etch mask layer, and an ARC layer (e.g., SiARC) is formed over the orientation control layer. In other embodiments, an organic planarization layer (OPL) and/or a protection layer may also be formed between the ARC layer and the orientation control layer. Regardless, a tapered etch profile/pattern may then be formed through the ARC and/or other layers.

A first aspect of the present invention provides a method for multilayer pattern transfer, comprising: forming an etch mask layer over a substrate; forming an orientation control layer over the etch mask layer; forming an ARC layer over the orientation control layer; and forming a tapered etch through at least the ARC layer.

A second aspect of the present invention provides a method for multilayer pattern transfer, comprising: forming a nitride layer over a substrate; forming an oxide layer over the nitride layer; forming an orientation control layer over the etch mask layer; forming an ARC layer over the orientation control layer; forming an organic planarization layer (OPL) below the ARC layer; and forming a tapered etch through at least the ARC layer.

A third aspect of the present invention provides a semiconductor device, comprising: an etch mask layer formed over a substrate; an orientation control layer over the etch mask layer; an ARC layer over the orientation control layer; and a tapered etch through at least the ARC layer.

BRIEF DESCRIPTION OF THE DRAWINGS

These and other features of this invention will be more readily understood from the following detailed description of the various aspects of the invention taken in conjunction with the accompanying drawings in which:

FIGS. 3A-C proposes stack options according to various embodiments of the present invention.

Figure 1:
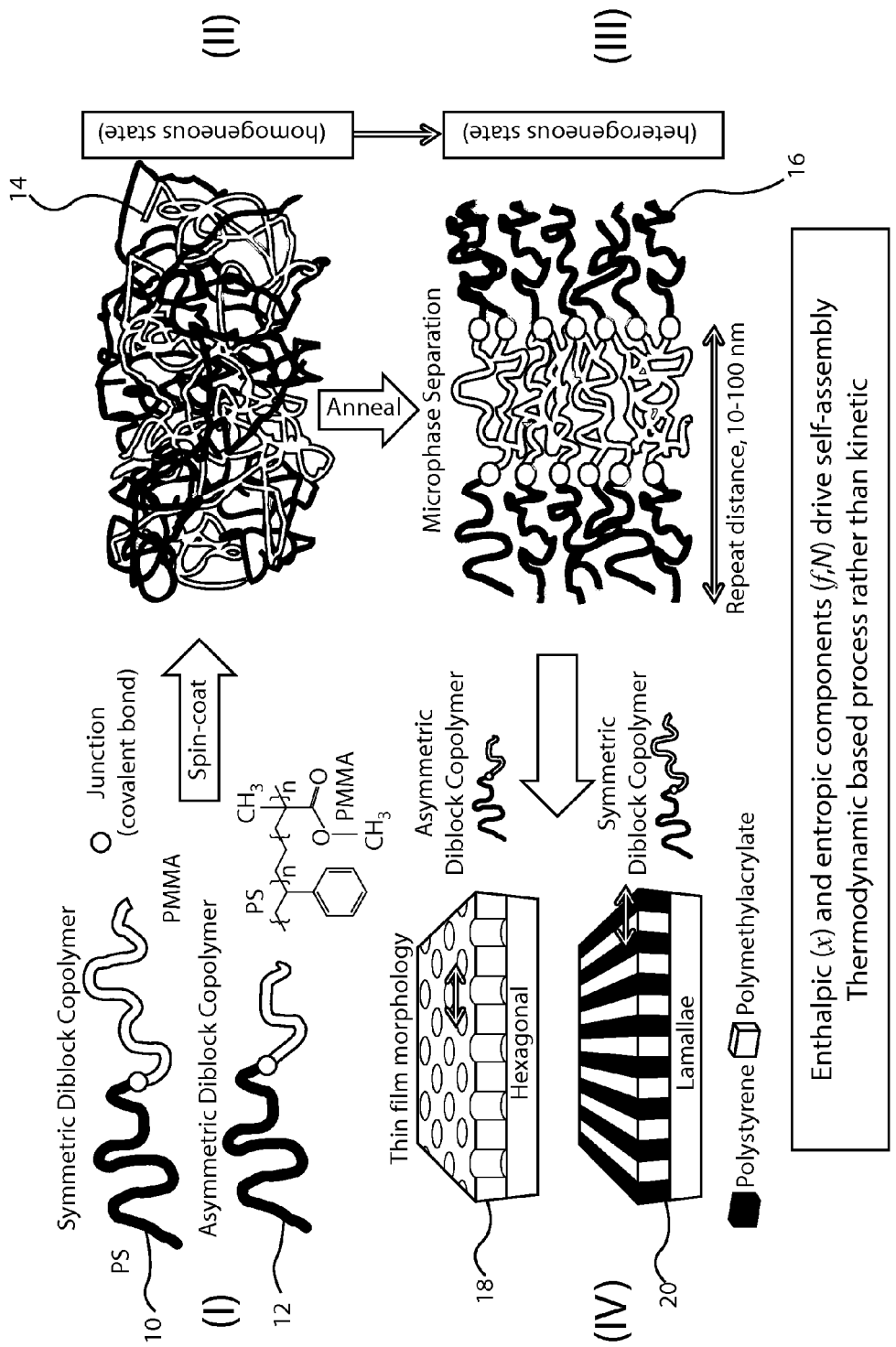
FIG. 1 shows a polymer phase separation stage of a DSA process according to an embodiment of the present invention.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Illustrative embodiments will now be described more fully herein with reference to the accompanying drawings, in which embodiments are shown. This disclosure may, however, be embodied in many different forms and should not be construed as limited to the embodiments set forth herein. Rather, these embodiments are provided so that this disclosure will be thorough and complete and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. The term "set" is intended to mean a quantity of at least one. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer) is present on a second element, such as a second structure (e.g. a second layer) wherein intervening elements, such as an interface structure (e.g. interface layer) may be present between the first element and the second element.

As indicated above, aspects of the present invention relate to approaches for multilayer pattern transfer. In a typical embodiment, a device is formed by forming an etch mask layer (e.g., a nitride layer and an oxide layer) over a substrate (e.g., silicon (Si)). An orientation control layer (e.g., a neutral layer) is then formed over the etch mask layer, and an ARC layer (e.g., SiARC) is formed over the orientation control layer. In other embodiments, an organic planarization layer (OPL) and/or a protection layer may also be formed between the ARC layer and the orientation control layer. Regardless, a tapered etch profile/pattern may then be formed through the ARC and/or other layers.

As such, aspects of the present invention described herein will utilize the following terms that shall have the associated meanings:

Directed self-assembly (DSA): using a physical surface/topography or chemically distinct alternating surface pattern to align block copolymers.

Block copolymer (BCP): Block copolymers are made up of covalently attached blocks of two or more different polymerized monomers.

Phase separation: Upon heating (or lowering of Tg), a block copolymer of two or more blocks will phase separate into distinct structures (resembling nanopatterns).

Graphoepitaxy: A physical/topographic pattern whereby the sidewall of a resist or oxide acts to guide to block polymers and align them in the same direction as the original guide pattern.

Chemoepitaxy: A substantially planar chemical pattern whereby the alternating chemical patterns act as a guide to block polymers and align them to the original guide pattern.

Polymer brush: A polymer which is chemically attached (grafted) to a surface by one chemical bond.

Neutralization layer: A layer which has no preferential affinity for any component of a block copolymer.

Typically, DSA requires an annealing step (i.e., a thermal anneal), which induces block copolymers (BCPs) to microphase separate and aligns the micro-domains in a thermodynamically preferred orientation. Referring to FIG. 1, a diagram depicting a polymer microphase separation phase/stage of DSA is shown. As depicted in steps I-IV, by spin-coating a symmetric di-block copolymer 10 or an asymmetric di-block copolymer 12 onto an underlayer, a phase-mixed BCP thin film 14 is formed. By thermal annealing the phase-mixed BCP film, it will undergo microphase separation to form a phase separated film. Thereafter, a thin film morphology will result to yield a hexagonal close packed array of cylinders 18 (from asymmetric copolymer 12) or a Lamallae line/space array 20 (from symmetric copolymer 10).

Figure 2:
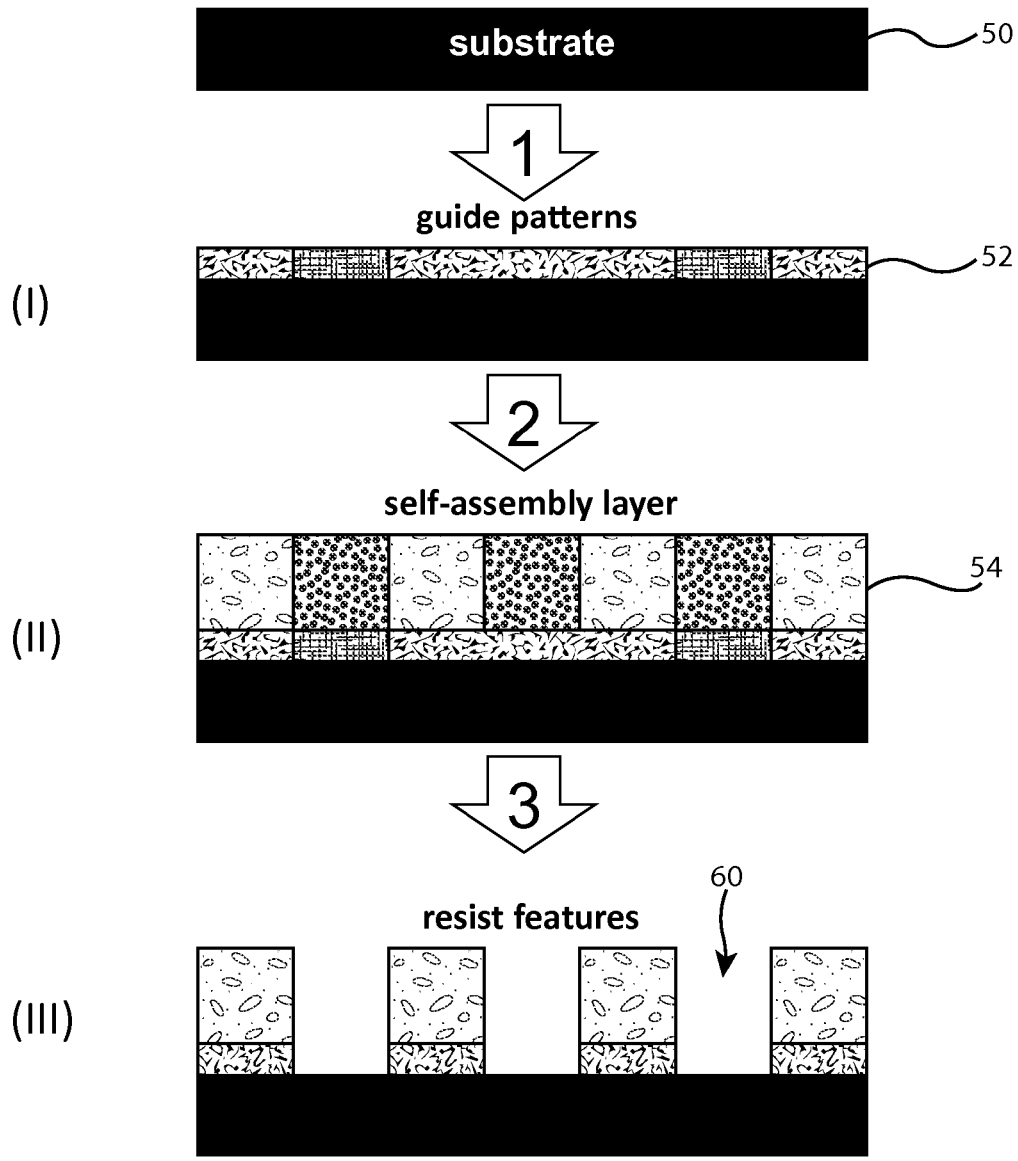
FIG. 2 shows a basic unit process for a DSA process.

Referring now to FIG. 2, a basic process (steps I-III) is shown for a DSA process. As depicted in step I, surface preparation and the creation of guide patterns 52 are performed on a substrate 50. In step II, a self-assembly layer 54 is formed over guide patterns 52 and then annealed. In step III, the formation of topographic resist features 60 are performed.

In general, various features are considered to be desirable for guide patterns 52. Specifically, guide patterns 52 may have field regions and feature regions. Field regions should be neutral to copolymer blocks (e.g., a random copolymer brush or mat). Feature regions should be "pinning" toward one of the blocks. This region may have similar chemical composition to one block. Moreover, this region may be a high surface energy region that pins the block with the higher surface energy. It might be desirable for feature regions to have a CD that is close to a desired CD after a pitch division. Along similar lines, a flat top surface might be an advantage (e.g., to improve CDU). Guide patterns 52 should be stable during overcoating of the subsequent block copolymer (BCP) layer and thermal processing.

Referring now to FIGS. 3A-C, various options for stack formations are depicted acceding to aspects of the present invention. Specifically, FIGS. 3A-C depict single layer stack 100, bi-layer stack 110, and tri-layer stack 120, respectively. Referring first to FIG. 3A, stack 100 comprises an oxide layer 102 formed over a substrate 62 and a nitride layer 64 (i.e., the oxide and nitride layer may collectively be referred to herein as an etch mask layer), and neutral layer (i.e., the neutral layer may also be referred to as an orientation controller layer. The neutral layer performs the function of both planarization layer and anti-reflection layer. The neutral layer may also comprise a grafted neutral portion/layer 104 and a non-grafted neutral portion layer 106. Regardless, an ARC layer 108 (e.g., optionally SiARC) will then be formed over non-grafted neutral layer 106. In addition, the coating formulations for the protection, neutral and ARC layers may use orthogonal solvents to ensure stack compatibility between each layer. It is understood that the use of an ARC layer is optional and that a photoresist layer (described below) could be formed directly on the non-grafted neutral layer.

Referring to FIG. 3B, a bi-layer approach is shown. As depicted, stack 110 comprises an oxide layer 112 over a nitride layer 64 and a substrate 62) (i.e., the oxide and nitride layer may collectively be referred to herein as an etch mask layer), a neutral layer 114 formed over oxide layer 112 (i.e., the neutral layer may also be referred to as an orientation controller layer), an OPL layer 116 formed over neutral layer 114, and an ARC layer 118 (e.g., SiARC) formed over neutral layer 114.

FIG. 3C shows that a tri-layer stack 120 may be formed with the insertion of a protection layer. Specifically, similar to stacks 100 and 110, stack 120 may be formed by first forming an oxide layer 122 over a nitride layer 64 and substrate 62 (i.e., the oxide and nitride layer may collectively be referred to herein as an etch mask layer). A neutral layer 124 (also referred to as an orientation controller layer) will be formed over an oxide layer/etch mask layer, and a protection layer 126 may be formed over neutral layer 124. OPL layer 128 will then be formed over protection layer 126, and ARC layer 130 (e.g., SiARC) will be formed over OPL layer 128. In addition, the coating formulations for the protection, neutral and OPL layers may use orthogonal solvents to ensure stack compatibility between each layer.

It is understood that although not shown, additional layers could be implemented hereunder. For example, four layer, five layer, etc., embodiments could be provided. Regardless, in accordance with any of these aspects, the natural layer/ orientation control layer is formed before the OPL layer rather than above the OPL layer.

Figure 4:
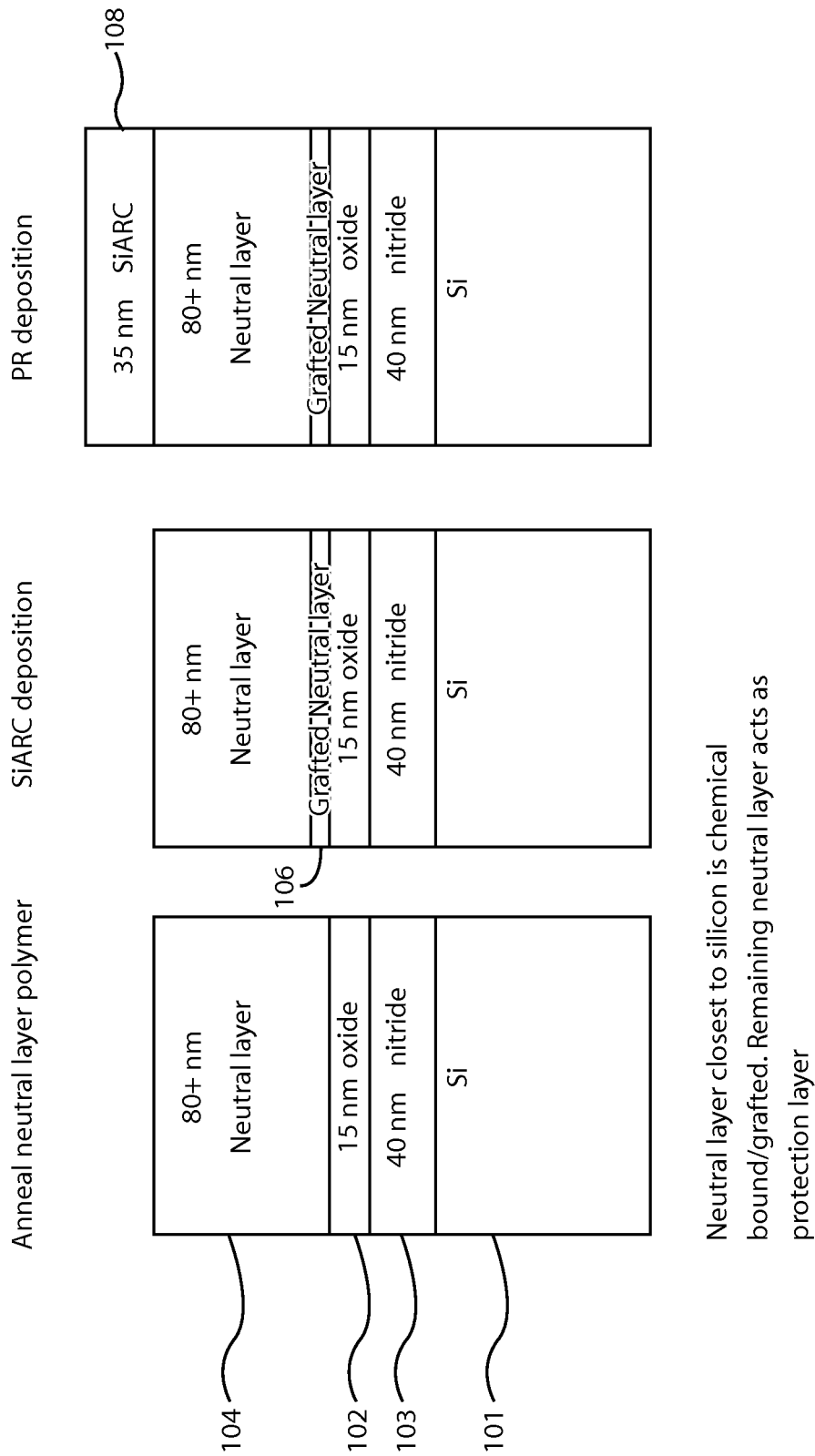
FIG. 4 shows a more detailed diagram of one stack option according to an embodiment of the present invention.
Figure 5:
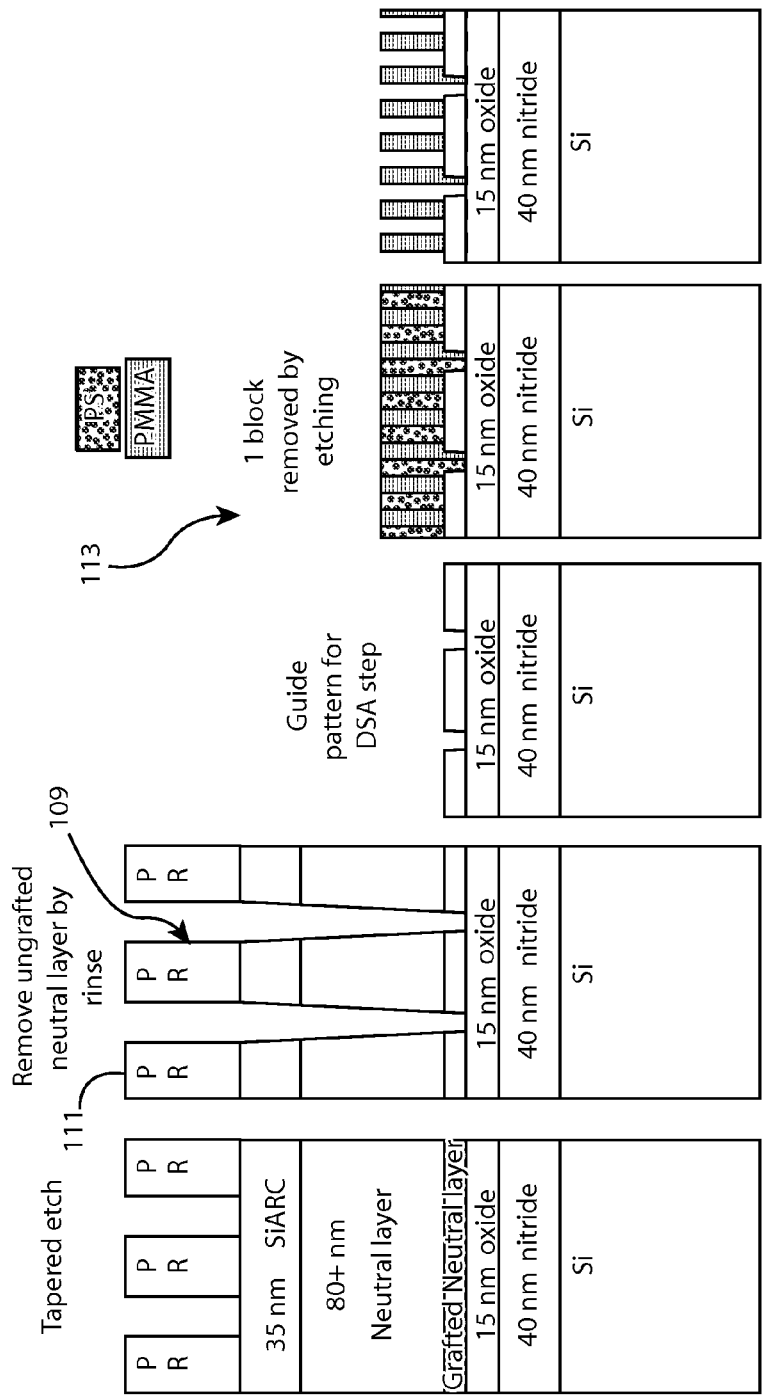
FIG. 5 shows a tapered etch profile in the stack option of FIG. 4 according to an embodiment of the present invention.

The various embodiments in FIGS. 3A-C will now be shown and described in greater detail in conjunction with FIGS. 4-9. Specifically, FIG. 4 shows the single layer approach of FIG. 3. As shown, substrate 101 is provided over which nitride layer 103, oxide layer 102, and neutral/orientation control layer 104 (e.g., also performing as an OPL layer) are formed. As further shown, a neutral layer may comprise a non-grafted portion 104 as well as a grafted portion 106. In any event, ARC layer 108 may then be formed over neutral layer 106. Referring now to FIG. 5, further processing is shown. As depicted, a photoresist layer 111 is patterned over the ARC layer (although as mentioned above, the ARC layer may be optional in which case photoresist layer 111 could be patterned over the neutral layer), and a tapered etch 109 profile is provided through the layers as shown. Additional processing steps 113 may then be performed such as the removal of the non-grafted neutral layer, applying a BCP, and removal of a block via wet chemical or plasma etching.

Figure 6:
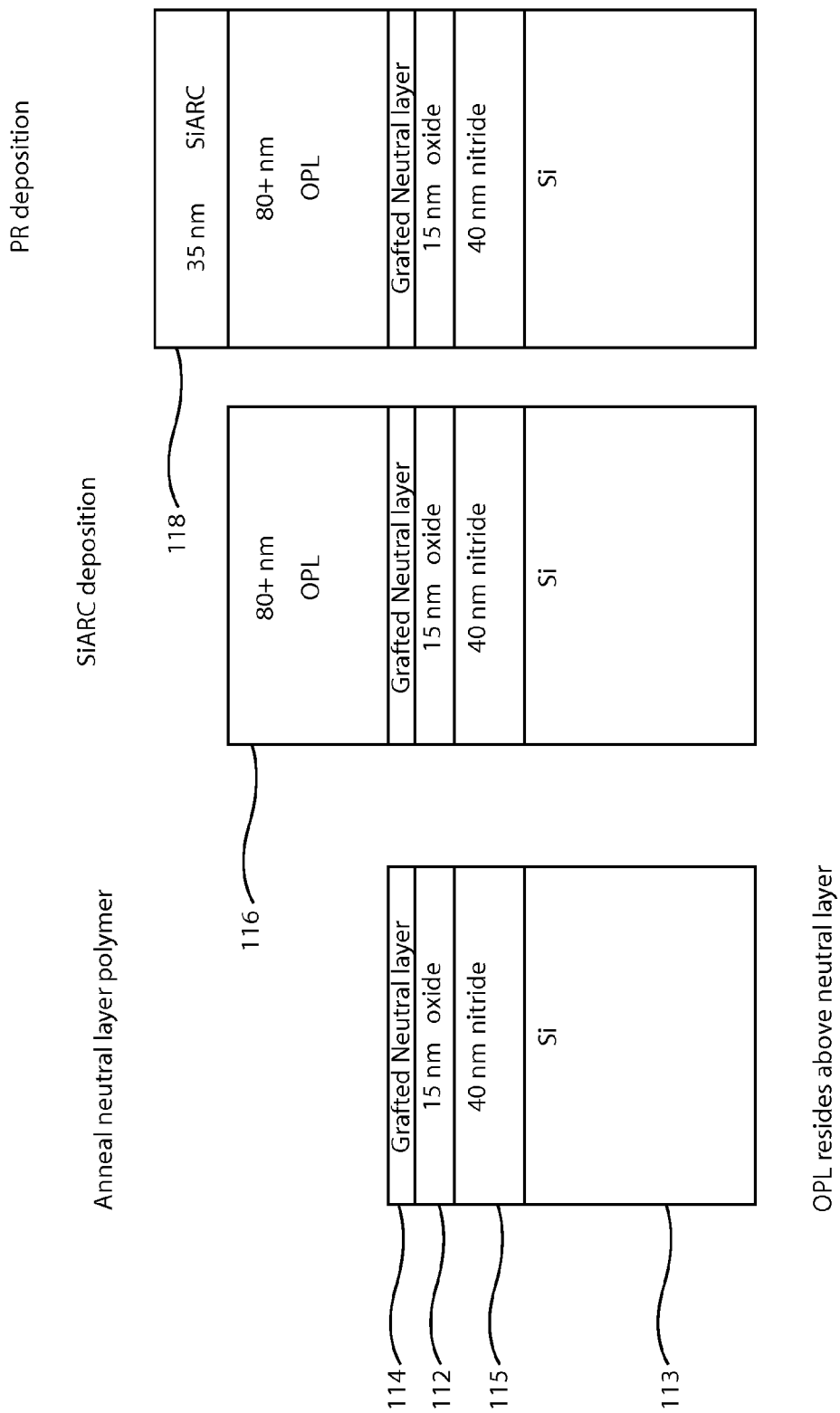
FIG. 6 shows a more detailed diagram of another stack option according to an embodiment of the present invention.
Figure 7:
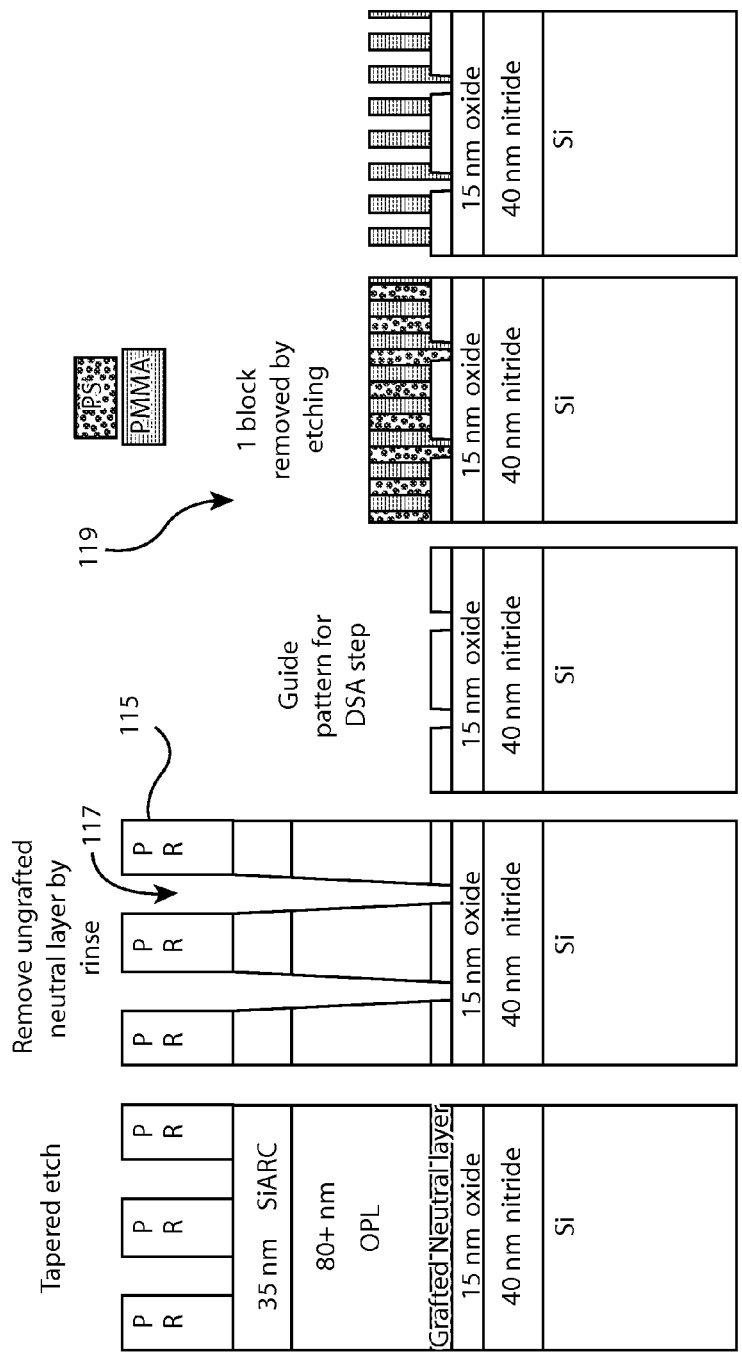
FIG. 7 shows a tapered etch profile in the stack option of FIG. 6 according to an embodiment of the present invention.

FIGS. 6-7 pertain to the embodiment shown in FIG. 3B. Specifically, FIG. 6 shows the bi-layer approach of FIG. 3B. As shown, substrate 113 is provided over which nitride layer 115, oxide layer 112, and neutral/orientation control layer 114 are formed. OPL layer 116 will then be formed over neutral layer 114, and ARC layer 118 will be formed over OPL layer 116. As further shown in FIG. 7, a photoresist layer 115 may then be formed over ARC layer 118, and a tapered etch profile may be formed similar to FIG. 5 (although as mentioned above, ARC layer may be optional in which case photoresist layer 115 could be patterned over the OPL). Moreover, similar to FIG. 5, additional processing steps 119 may then be performed such as the removal of the non-grafted neutral layer, applying a BCP, and removal of a block via wet chemical or plasma etching.

Figure 8:
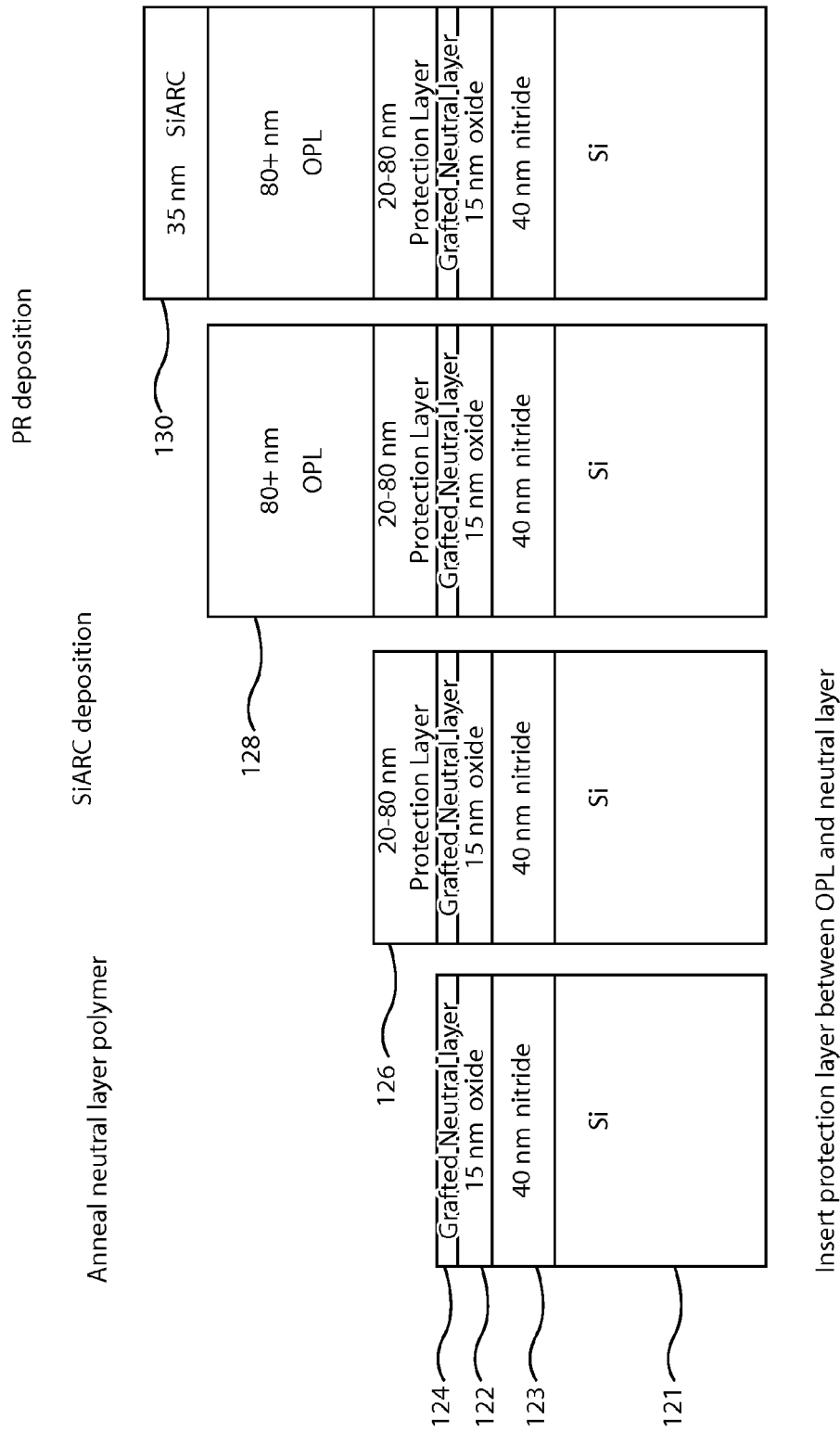
FIG. 8 shows a more detailed diagram of another stack option according to an embodiment of the present invention.
Figure 9:
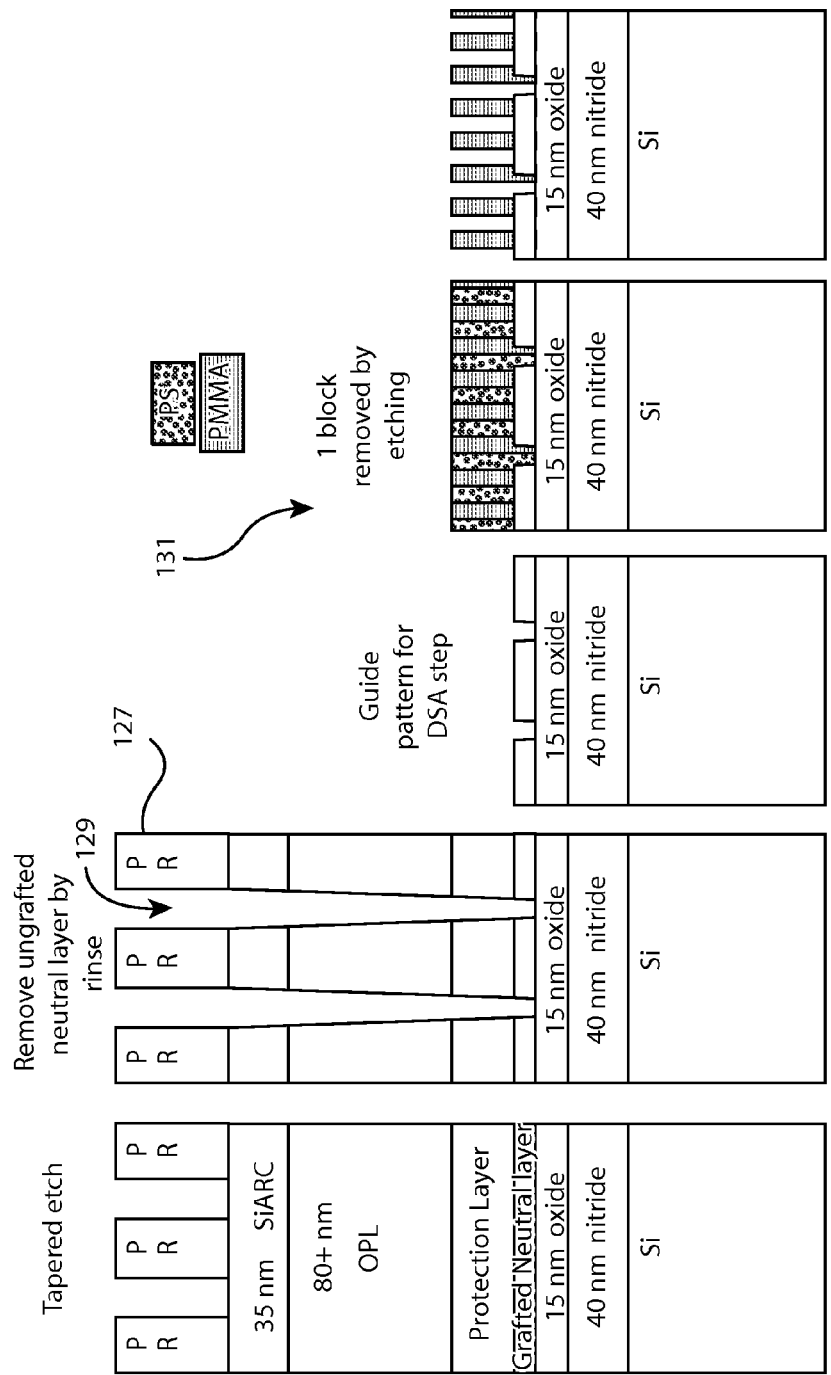
FIG. 9 shows a tapered etch profile in the stack option of FIG. 8 according to an embodiment of the present invention.

FIGS. 8-9 pertain to the embodiment shown in FIG. 3C. Specifically, FIG. 8 shows the tri-layer approach of FIG. 3C. As shown, substrate 121 is provided over which nitride layer 123, oxide layer 122, and neutral/orientation control layer 124 are formed. A protection layer 126 will then be formed over neutral layer 124, to ensure the surface chemistry of the underlying neutral brush is maintained during subsequent layer depositions and photoresist patterning. The protection layer may also be an absorbing polymer or dye which is stable to the over coated ARC layers. Exemplary materials for protection layer include polystyrene, polymethylglutarimide, random copolymer of styrene-Polymethylacrylate, diBARC (developable bottom anti-reflective coatings), Teflon-based polymers and polyfluoroalkyletheres. An OPL layer 128 will then be formed over neutral layer 124. Then, an ARC layer 130 will be formed over OPL layer 128. As further shown in FIG. 9, a photoresist layer 127 may then be formed over the ARC layer, and a tapered etch profile 129 may be formed similar to FIGS. 5 and 7 (although as mentioned above, the ARC layer may be optional in which case photoresist layer 127 could be patterned over the OPL). Moreover, similar to FIGS. 5 and 7, additional processing steps 131 may then be performed such as the removal of the non-grafted neutral layer, applying a BCP, and removal of a block via wet chemical or plasma etching.

Figure 10:
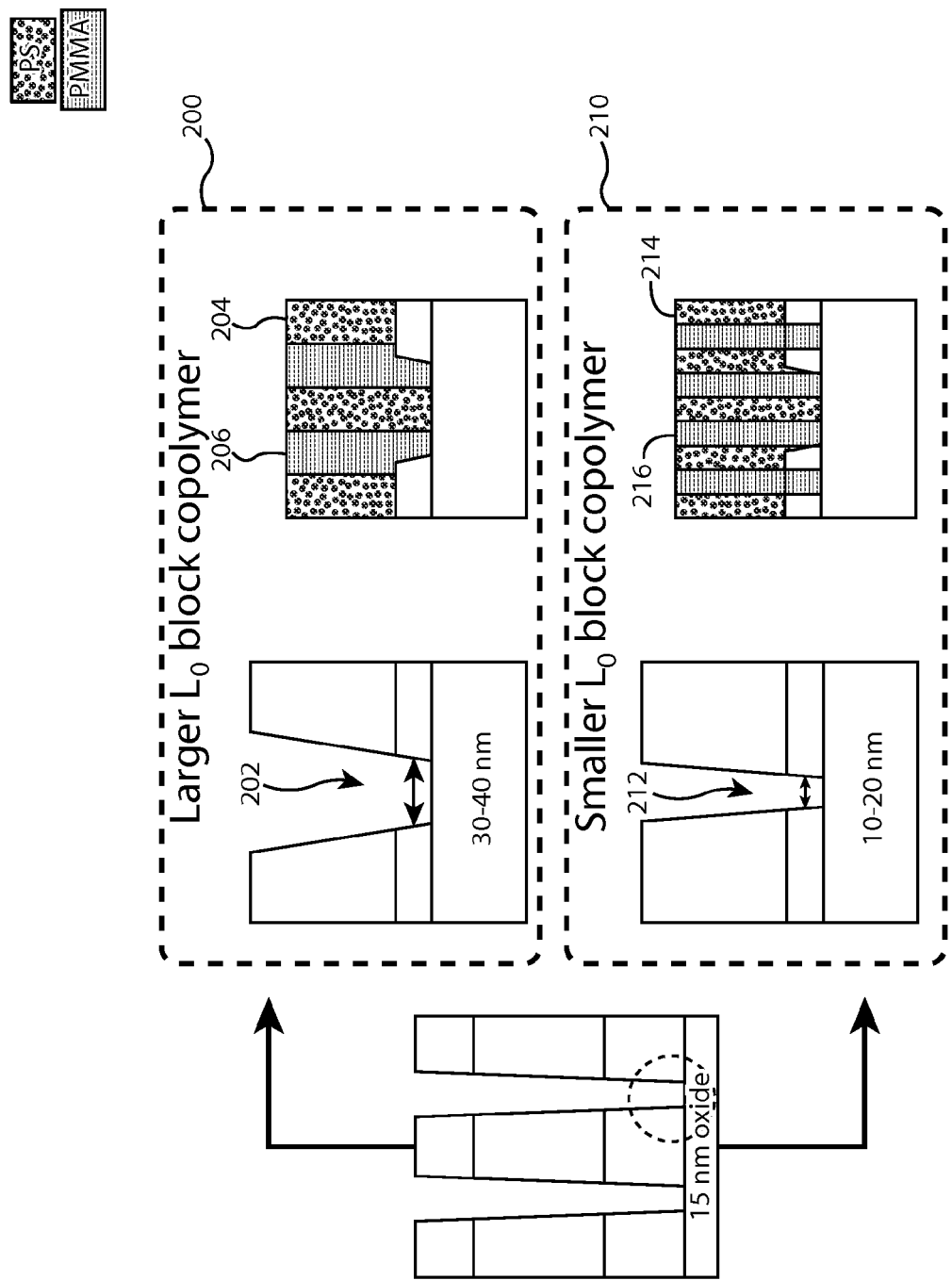
FIG. 10 shows the use of a tapered etch for a DSA process according to an embodiment of the present invention.

Referring now to FIG. 10, various copolymer block options provided hereunder are shown for tuning the critical dimension of the final guide pattern. As shown, block copolymers 200 and 210 are shown. Larger block copolymer 200 comprises a larger tapered etch profile 202 that is finished with materials 204 and 206. Conversely, smaller block copolymer 210 has a smaller etch profile 212 that is finished with materials 214 and 216.

In various embodiments, design tools may be provided and configured to create the data sets used to pattern the semiconductor layers as described herein. For example, data sets may be created to generate photomasks used during lithography operations to pattern the layers for structures as described herein. Such design tools can include a collection of one or more modules and can also include hardware, software, or a combination thereof. Thus, for example, a tool may be a collection of one or more software modules, hardware modules, software/hardware modules, or any combination or permutation thereof. As another example, a tool may be a computing device or other appliance on which software runs or in which hardware is implemented. As used herein, a module might be implemented utilizing any form of hardware, software, or a combination thereof. For example, one or more processors, controllers, application-specific integrated circuits (ASIC), programmable logic arrays (PLAs), logical components, software routines, or other mechanisms might be implemented to make up a module. In implementation, the various modules described herein might be implemented as discrete modules or the functions and features described may be shared in part or in total among one or more modules. In other words, as would be apparent to one of ordinary skill in the art after reading this description, the various features and functionality described herein may be implemented in any given application and may be implemented in one or more separate or shared modules in various combinations and permutations. Even though various features or elements of functionality may be individually described or claimed as separate modules, one of ordinary skill in the art will understand that these features and functionality may be shared among one or more common software and hardware elements, and such description shall not require or imply that separate hardware or software components are used to implement such features or functionality.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention.

Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for multilayer pattern transfer, comprising:
    forming an etch mask layer over a substrate;
    forming an orientation control layer over the etch mask layer;
    forming an organic planarization layer (OPL) over the orientation control layer;
    forming an ARC layer over the OPL layer; and
    forming a tapered etch through at least the ARC layer.

2. The method of claim 1, the forming of the etch mask layer comprising:
    forming a nitride layer over the substrate; and
    forming an oxide layer over the nitride layer.

3. The method of claim 1, at least a portion of the orientation control layer simultaneously functioning as the OPL layer and orientation control layer.

4. The method of claim 3, the orientation control layer comprising a grafted component and a non-grafted component.

5. The method of claim 1, further comprising:
    forming a photoresist layer over the ARC layer; and
    patterning the photoresist layer,
        forming the tapered etch using the patterned photoresist layer as a mask.

6. The method of claim 5, wherein the tapered etch controls a critical dimension of a guide pattern.

7. A method for multilayer pattern transfer, comprising:
    forming a nitride layer over a substrate;
    forming an oxide layer over the nitride layer;
    forming an orientation control layer over the oxide layer;
    forming an ARC layer over the orientation control layer;
    forming an organic planarization layer (OPL) below the ARC layer; and
    forming a tapered etch through at least the ARC layer.

8. The method of claim 7, at least a portion of the orientation control layer simultaneously functioning as the OPL layer and orientation control layer.

9. The method of claim 8, the orientation control layer comprising a grafted component and a non-grafted component.

10. The method of claim 7, the OPL layer being formed between the orientation control layer and the ARC layer.

11. The method of claim 7, further comprising forming a protection layer between the orientation control layer and the OPL layer.

12. The method of claim 7, further comprising:
    forming a photoresist layer over the ARC layer; and
    patterning the photoresist layer,
        forming the tapered etch using the patterned photoresist layer as a mask.

13. The method of claim 12, wherein the tapered etch controls a critical dimension of a guide pattern.

* * * * *